United States Patent [19]

Ishida et al.

[11] 4,274,057
[45] Jun. 16, 1981

[54] MPX STEREOPHONIC DEMODULATION

[75] Inventors: Kohji Ishida; Tatsuo Numata, both of Tokyo, Japan

[73] Assignee: Pioneer Electronic Corporation, Tokyo, Japan

[21] Appl. No.: 54,116

[22] Filed: Jul. 2, 1979

[30] Foreign Application Priority Data

Jun. 30, 1978 [JP] Japan .................................. 53-80010

[51] Int. Cl.³ ............................ G01P 3/48; G01P 3/54
[52] U.S. Cl. .................................... 329/167; 179/1 G; 329/103; 329/101; 329/50
[58] Field of Search .................. 329/167, 50, 102, 103, 329/146, 101; 179/1 GJ, 1 GC, 1 GD, 1 GE, 1 GH, 1 GM, 1 GN

[56] References Cited

U.S. PATENT DOCUMENTS 3,569,633   3/1971   Braham ............................ 179/1 GM
3,707,603   12/1972  Limberg ........................... 179/1 GE Primary Examiner—David K. Moore
Attorney, Agent, or Firm—Sughrue, Rothwell, Mion, Zinn and Macpeak

[57] ABSTRACT

An MPX stereophonic demodulation switching circuit having first and second identical switching circuits adapted to transmit a composite input signal to respective output terminals. First and second switching elements are connected respectively between the junction points of resistors in first and second transmission paths in each switching circuit, and a reference voltage line. A voltage follower circuit is provided to produce a reference voltage. Groups of resistors are connected in parallel between the output terminal of the voltage follower and one respective output terminal. Third and fourth switching elements are connected respectively between the connection points of the resistors in each group of resistors and the reference voltage line in each switching circuit. Opposite pairs of switching elements in the two switching circuits are controlled to be alternately rendered conductive and non-conductive.

13 Claims, 9 Drawing Figures

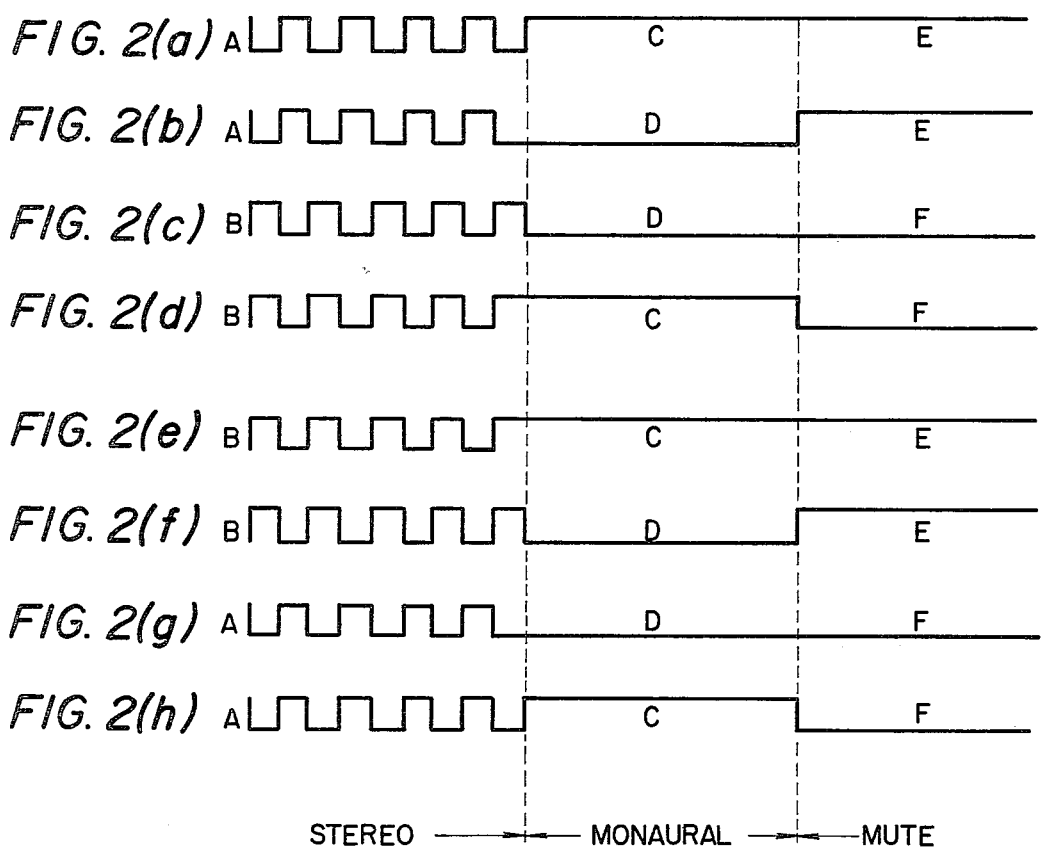

MPX STEREOPHONIC DEMODULATION

BACKGROUND OF THE INVENTION

This invention relates to stereophonic signal demodulation circuits, and more particularly to an FM multiplex (MPX) stereophonic signal demodulation circuit.

Heretofore, a double balanced type demodulation circuit comprising differential amplifiers has been employed as an FM MPX stereophonic signal demodulation circuit. In this conventional demodulation circuit, the differential amplifiers are cascade-connected in a two-stage state. Therefore, the power supply utilization factor is low, but it is impossible to increase the dynamic range. Furthermore, since the signal distortions of the differential transistors in the stages are superposed, it is difficult to reduce the distortion factor. In addition, because of the unbalance in characteristics of the differential transistors, distortion occurs, and the right and left channel signals have differences in level. Moreover, for muting operation in the selection of an FM broadcast station, it is necessary to provide a particular muting circuit in the rear stage of the double balanced type demodulation circuit.

In order to eliminate the above-mentioned drawbacks accompanying in the double balanced type demodulation circuit, a switching type demodulation circuit has been formulated which employs a chopper type switching circuit to thereby separate the information into right and left channels. In this prior art chopper type switching circuit, however, switching pulses, i.e., the leak of the sub carrier, appear on the output terminal, thereby causing the signal to noise ratio to be degraded. Another drawback in this switching circuit is that the level of the output signal when receiving monaural and stereophonic signals are not equal.

SUMMARY OF THE INVENTION

Accordingly, an object of this invention is to provide an improved MPX stereophonic demodulation circuit in which the above-mentioned described drawbacks, such as dynamic range reduction, the increase of distortion factor and the provision of the muting circuit, accompanying the conventional double balance demodulation circuit have been eliminated.

It is another object of this invention to provide an MPX demodulation circuit where the output signal level is always constant irrespective of reproduction mode.

These and other objects of this invention are accomplished in an MPX stereophonic demodulation circuit having first and second identical switching circuits adapted to transmit a composite input signal to respective output terminals. First and second switching elements are connected respectively between the junction points of resistors in first and second transmission paths in each switching circuit and a reference voltage line. A voltage follower circuit is provided to produce a reference voltage. Third and fourth switching elements are connected respectively to the connection points of groups of resistors that are connected in parallel between the output terminal of the voltage follower circuit and one respective output terminal. Opposite pairs of switching elements in the two switching circuits are controlled to be alternately rendered conductive and non-conductive.

BRIEF DESCRIPTION OF THE DRAWINGS

In the drawings:
FIGS. 2a-2h are waveforms of the control signals applied to the switching transistors shown in FIG. 1.

DETAILED DESCRIPTION OF THE PREFERRED EMBODIMENT

Figure 1:
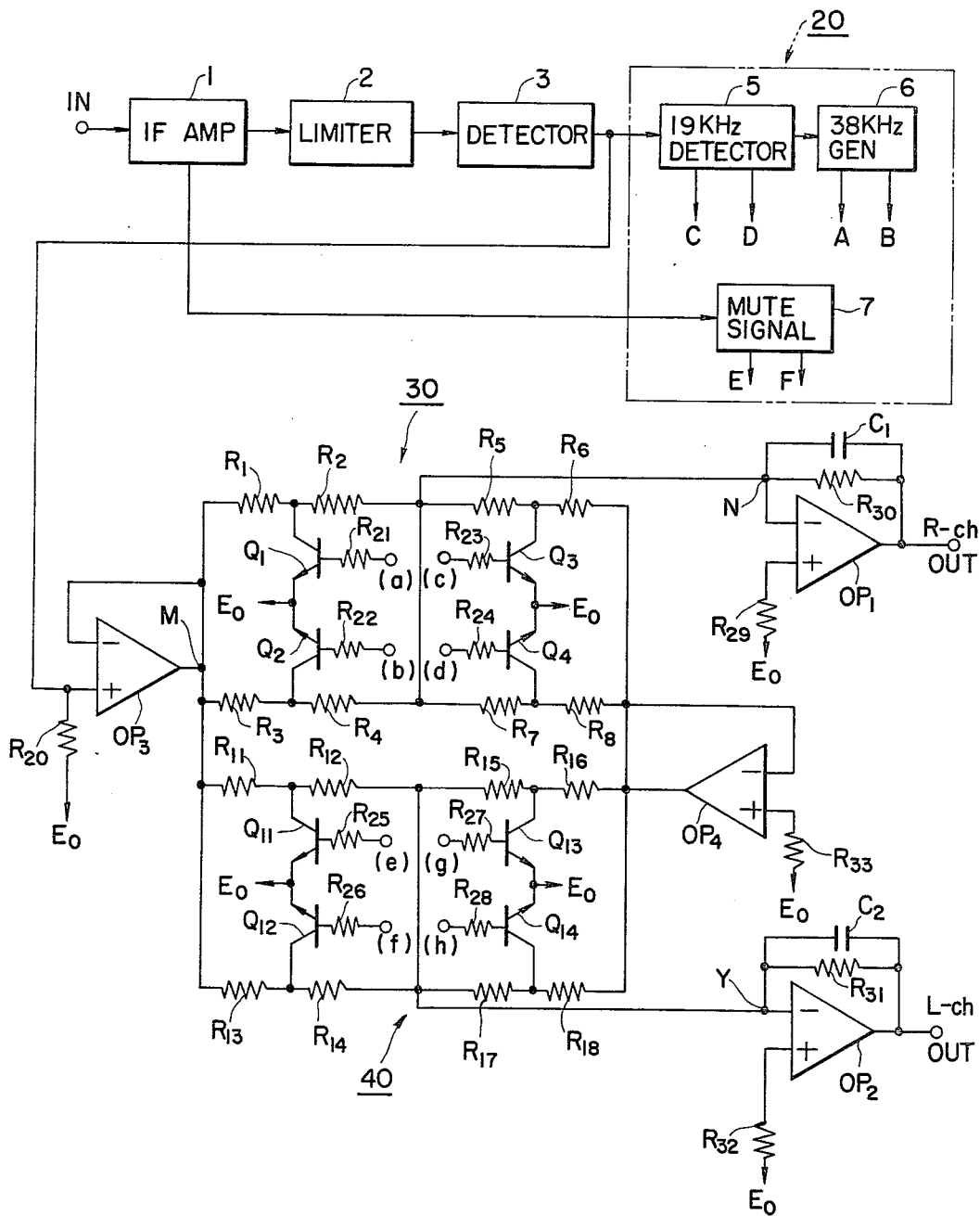
FIG. 1 is a block diagram of an FM receiver including a stereophonic demodulation circuit according to one embodiment of the present invention.

One embodiment according to the present invention will now be described with reference to the accompanying drawings.

FIG. 1 is a circuit diagram illustrating one embodiment of the present invention. An intermediate frequency signal derived from a front end (not shown) is amplified by an IF (Intermediate Frequency) amplifier and is then subjected to an amplitude limitation by a limiter 2. Thereafter the signal is FM detected by an FM detector 3 and a composite signal is obtained. The composite signal contains a main signal which is the sum of the left and the right signals, i.e. L+R, an auxiliary signal obtained by amplitude modulating a sub carrier (38 KHz) with the difference signal, L−R, and a 19 KHz pilot signal. The composite signal is then demodulated into a left signal and a right signal by an MPX demodulation circuit.

In the demodulation circuit according to the present invention, the composite signal is applied to a buffer circuit which comprises an operational amplifier $OP_3$. The operational amplifier $OP_3$ has an inverted and non-inverted input terminals and an output terminal and constitutes a voltage follower circuit wherein the inverted input and the output terminals are short-circuited and the composite signal is applied to the non-inverted terminal to which a reference voltage is applied through a resistor $R_{20}$. Accordingly, the composite signal superimposed on the reference d.c. voltage $E_0$ is produced from the output terminal of the operational amplifier $OP_3$.

A first switching circuit 30 is provided between the output M of the operational amplifier $OP_3$ and the inverted input N of an operational amplifier $OP_1$. Similarly, a second switching circuit 40 is provided between the output M of the operational amplifier $OP_3$ and the inverted input Y of an operational amplifier $OP_2$. In the operational amplifier $OP_1$, a feed back resistor $R_{30}$ is provided between the inverted input N and the output of the amplifier $OP_1$. In the operational amplifier $OP_2$, a feed back resistor $R_{31}$ is provided between the inverted input Y and the output of the amplifier $OP_2$. In the operational amplifiers $OP_1$ and $OP_2$, reference voltages $E_0$ are applied to the non-inverted input terminals through resistors $R_{29}$ and $R_{32}$, respectively.

Referring to the first switching circuit 30, first and second transmission paths are formed in parallel between the output M of the operational amplifier $OP_3$ and the input N of the operational amplifier $OP_1$. The first transmission path is a series connection of resistors $R_1$ and $R_2$ while the second transmission path is a series-connection of resistors $R_3$ and $R_4$. A first switching device comprising a transistor $Q_1$ is provided between the juncture point of the resistors $R_1$ and $R_2$ and the line of reference voltage $E_0$ while a second switching device comprising a transistor $Q_2$ is provided between the juncture point of the resistors $R_3$ and $R_4$ and the line of reference voltage $E_0$.

A voltage follower circuit comprising an operational amplifier OP₄ is provided and a reference voltage E₀ is produced from the output terminal thereof.

First and second resistor paths each comprising resistor elements are formed in parallel between the output of the operational amplifier OP₄ and the input terminal N of the operational amplifier OP₁. The first resistor path is a series-connection of resistors R₅ and R₆ while the second resistor path is a series-connection of resistors R₇ and R₈. A third switching device comprising a transistor Q₃ is provided between the juncture point of resistors R₅ and R₆ and the line of the reference voltage E₀ while the fourth switching device comprising a transistor Q₄ is provided between the juncture point of resistors R₇ and R₈ and the line of the reference voltage E₀. The transistors Q₁, Q₂, Q₃ and Q₄ are controlled by respective control signals (a), (b), (c) and (d) applied to the bases of the transistors Q₁ to Q₄ through base resistors R₂₁, R₂₂, R₂₃ and R₂₄, respectively.

The circuit construction of the second switching circuit 40 is identical to that of the preceding switching circuit 30. Transistors Q₁₁, Q₁₂, Q₁₃ and Q₁₄ operate as switching devices and controlled by respective control signals (e), (f), (g) and (h) applied to the bases of the transistors Q₁₁ to Q₁₄ through base resistors R₂₅, R₂₆, R₂₇ and R₂₈, respectively.

A control signal generation circuit 20 is provided for implementing on-off operation of the respective transistors. The 19 KHz pilot signal is detected from the composite signal by a 19 KHz signal detection circuit 5. The frequency of this 19 KHz pilot signal is doubled and then a 38 KHz signal A whose phase is the same as that of the sub carrier and a 38 KHz signal B whose phase is opposite to the sub carrier are obtained from a 38 KHz signal generation circuit 6.

The 19 KHz detection circuit 5 is constituted to provide outputs of a high level signal C and a low level signal D when the monaural signal is received, i.e. at the time when the pilot signal is not present.

A mute control signal generation circuit 7 is provided for detecting the signal in the IF amplifier 1 and generating mute control signals. High and low level mute control signals are produced from the mute control signal generation circuit 7. These signals, E and F, are generated simultaneously upon detection that the IF signal is not present during the selecting operation of broadcast stations.

In stereophonic operation, the output signal A of the 38 KHz signal generation circuit 6 is applied to the bases of the transistors Q₁, Q₂, Q₁₃ and Q₁₄ and that the output signal B of the 38 KHz signal generating circuit 6 is applied to the bases of the transistors Q₃, Q₄, Q₁₁ and Q₁₂ (see FIG. 2). When the signal A is at a high level, the transistors Q₁, Q₂, Q₁₃ and Q₁₄ are rendered conductive. As a result, the signal of the same phase as the phase of the 38 KHz signal appears on the output of the operational amplifier OP₂. This signal is for L-channel. Inversely, when the signal B is at a high level, the transistors Q₁₁, Q₁₂, Q₃ and Q₄ are rendered conductive. As a result, a signal of the opposite phase to the phase of the 38 KHz signal appears on the output of the operational amplifier OP₁. This is for R-channel.

The switching circuit 30 is constituted in such a way that the transistors Q₃ and Q₄ and the resistance network R₅ to R₈ are balanced with the transistors Q₁ and Q₂ and the resistance network R₁ to R₄, thereby providing the d.c. balance at the output side caused by the voltages developed across the collectors and emitters when the transistors are conductive. Consequently, switching control signal is prevented from leaking out to the output side. The above is equally true for the switching circuit 40.

In monaural operation, the high level signal C and the low level signal D are generated from the 19 KHz detection circuit 5 in the control signal generation circuit 20. The transistors Q₁, Q₄, Q₁₁ and Q₁₄ are rendered conductive in response to the high level signal C while the transistors Q₂, Q₃, Q₁₂ and Q₁₃ are rendered non-conductive in response to the low level signal D (see FIG. 2). Accordingly, the output signal of the operational amplifier OP₃ is applied to both the inverted terminal of the operational amplifier OP₁ via the resistors R₃ and R₄ and the inverted terminal of the operational amplifier OP₂ via the resistors R₁₃ and R₁₄. As a result, the same signal is delivered to the output terminals for left and right channels.

In the case of monaural operation, the gain $A_{m1}$ of the operational amplifier OP₁ is approximately equal to $-R_{30}/(R_3+R_4)$, and the gain $A_{m2}$ of the operational amplifier OP₂ is approximately equal to $-R_{31}/(R_{13}+R_{14})$. On the other hand, in the case of the stereophonic operation, the gains of the operational amplifiers OP₁ and OP₂ are represented by the following equations:

$$A_{s1} = -\frac{R_{30}}{(R_1+R_2)//(R_3+R_4)}$$

$$A_{s2} = -\frac{R_{31}}{(R_{11}+R_{12})//(R_{13}+R_{14})}$$

In the above equations, if $R_1=R_3$, $R_2=R_4$, $R_{11}=R_{13}$ and $R_{12}=R_{14}$, the gains of the operational amplifiers OP₁ and OP₂ become as follows:

$$A_{m1} = \tfrac{1}{2} A_{s1}$$

$$A_{m2} = \tfrac{1}{2} A_{s2}$$

Since the demodulation efficiency is 50% in the case of stereophonic operation due to the switching operations of the transistors, the level difference in monaural and stereophonic operations is eliminated. Particularly, by selecting the resistors to satisfy the relationship of $R_{30}=R_{31}$, $R_1=R_3=R_{11}=R_{13}$ and $R_2=R_4=R_{12}=R_{14}$, the gains of the operational amplifiers become equal and thus the levels in left and right channels become equal. Further, by selecting the resistors to satisfy the relationship of $R_5=R_7=R_2$ ($=R_4$), $R_6=R_8=R_1$ ($=R_3$), $R_{15}=R_{17}=R_{12}$ ($=R_{14}$) and $R_{16}=R_{18}=R_{11}$ ($=R_{13}$), the fluctuation of the d.c. level in the output side caused by the on and off operation of the switching transistors in the stereophonic operation can be completely suppressed, and thus the prevention of the carrier leak can be achieved.

The operation of the mute signal generation circuit will now be described. No input signal is presented in the IF amplifier during the selecting operation of broadcast stations, and this phenomenon is detected by the mute signal generation circuit 7 which generates a high level mute signal E and a low level mute signal F. The transistors Q₁, Q₂, Q₁₁ and Q₁₂ are rendered conductive in response to the high level signal E while the transistors Q₃, Q₄, Q₁₃ and Q₁₄ are rendered non-conductive in response to the low level signal F, thereby enabling the switching circuit to implement the mute operation. In this case, if the resistors are selected as described above, the fluctuation of the d.c. level at the output side does not occur when the mute operation is changed over. As a result, unwanted pop sounds are not produced.

As described above, according to the present invention, no carrier leak is caused by the switching operation of the switching circuits 30 and 40 and the signal levels at the monaural operation and the stereophonic operation become equal. Moreover, highly precise muting operation can be accomplished without the attachment of a particular mute circuit. In addition, various conventional drawbacks such as the increase of the distortion caused by the conventional double balance type MPX demodulator, the lowering of the dynamic range, can be eliminated. Hence, an improved stereo demodulation circuit of high equality can be provided.

What is claimed is:

1. An MPX stereophonic demodulation circuit comprising: first and second switching circuits to transmit a composite input signal to respective output terminals; a reference voltage line; each of said switching circuits having (i) first and second transmission paths and (ii) first and second switching elements connected respectively between points on said transmission paths and said reference voltage line; a voltage follower circuit; each of said switching circuits further comprising (i) first and second parallel resistor paths between said voltage follower circuit and one of said output terminals and (ii) third and fourth switching elements connected respectively between points on said resistor paths and said reference voltage line; and means to render opposite pairs of switching elements in said two switching circuits to be conductive at the same time whereby said composite input signal is demodulated at said output terminals.

2. A circuit as in claim 1, wherein said first transmission paths are made up of a series circuit of first and second resistors, said second transmission paths are made up of a series circuit of third and fourth resistors, said first switching element in each switching circuit connected between the series connection point of said first and second resistors and said reference voltage line, and said second switching element in each switching circuit connected between the series connection point of said third and fourth resistors and said reference voltage line.

3. The circuit as in claim 2, wherein in each switching circuit the first and third resistors in each transmission path are equal to each other and the second and fourth resistors in each transmission path are equal to each other.

4. The circuit as in claims 2 or 3, wherein said first resistor paths are made up of a series circuit of fifth and sixth resistors, said second resistors paths are made up of a series circuit of seventh and eighth resistors, said third switching elements in each switching circuit connected between the series connection point of said fifth and sixth resistors and said reference voltage line and, said fourth switching element in each switching circuit connected between the series connection point of said seventh and eighth resistors and said reference voltage line.

5. The circuit as in claim 4, wherein in each switching circuit said second, fourth, fifth and seventh resistors have equal resistances and said first, third, sixth and eighth resistors have equal resistances.

6. The circuit as in claim 1, further comprising a first operational amplifier receiving said composite input signal and acting as a buffer circuit to said switching circuits.

7. The circuit as in claim 6, further comprising second and third operational amplifiers, said first switching circuit disposed between said first and second operational amplifiers and said second switching circuit disposed between said first and third operational amplifiers.

8. The circuit as in claim 7, wherein each of said operational amplifiers has an output terminal, inversion input terminal and a non-inversion input terminal, the output and inversion terminals of said first operational amplifier being short circuited and said composite signal being applied to said non-inversion terminal thereof.

9. The circuit as in claim 8, further comprising feed back circuits between the output and inversion terminals of said second and third operational amplifiers.

10. The circuit as in claim 1, wherein said means to render opposite pairs of switching elements conductive comprises a control signal generation circuit having a pilot signal detector and a signal generation circuit.

11. The circuit as in claims 1 or 10, further comprising means to render opposite switching elements in each switching circuit conductive.

12. The circuit as in claims 1 or 10, further comprising a muting circuit to render the same pairs of switching elements in each switching circuit conductive and non-conductive.

13. The circuit as in claim 12, wherein said first and second switching elements in each switching circuit are rendered conductive and said third and fourth switching elements in each switching circuit are rendered non-conductive.

* * * * *